(12) United States Patent
Grau

(10) Patent No.: US 6,742,167 B2
(45) Date of Patent: May 25, 2004

(54) METHOD FOR DETERMINING ELECTRICAL CHARACTERISTICS OF A MULTIPLE CONDUCTOR DEVICE

(76) Inventor: Günter Grau, In der Mlere 22, D-46282 Dorsten (DE)

( * ) Notice: Subject to any disclaimer, the term of this patent is extended or adjusted under 35 U.S.C. 154(b) by 97 days.

(21) Appl. No.: 10/083,696

(22) Filed: Feb. 26, 2002

(65) Prior Publication Data

US 2002/0144220 A1 Oct. 3, 2002

(30) Foreign Application Priority Data

Feb. 28, 2001 (DE) .......................................... 101 09 554

(51) Int. Cl.[7] .............................................. G06F 17/50
(52) U.S. Cl. .............................................. 716/4; 716/5
(58) Field of Search ...................................... 716/1–18

(56) References Cited

U.S. PATENT DOCUMENTS

| | | | | |
|---|---|---|---|---|
| 5,243,547 A | * | 9/1993 | Tsai et al. | 364/578 |
| 5,625,578 A | | 4/1997 | DuCloux et al. | 364/578 |
| 5,751,591 A | | 5/1998 | Asada | 364/488 |
| 5,923,230 A | * | 7/1999 | Yoshida et al. | 333/161 |
| 6,462,481 B1 | * | 10/2002 | Holland et al. | 315/111.21 |
| 2003/0048150 A1 | * | 3/2003 | Clarke et al. | 333/101 |

OTHER PUBLICATIONS

Wang et al., "Analysis of the Skin Effect for Calculating Frequency–Dependent Impedance of the TRTS Power Rail," IEEE, 1999, pp. 419–428.*

Beattie et al., "Inductance 101: Modeling and Extraction," IEEE, Jun. 18–22, 2001, pp. 1–6.*

Ghandakly et al., "A Model to Predict Current Distributions in Heavy Current Parallel Conductor Configurations," IEEE, 1991, pp. 1098–1103.*

Ghandakly et al., "A Model to Predict Current Distributions in Heavy Current Parallel Conductor Configurations," IEEE, Mar./Apr. 1994, pp. 240–244.*

Deutsch et al., Multi–Line Crosstalk and Common–Mode Noise Analysis, IEEE, 2000, pp. 317–320.

He et al., SPIE: Sparse Partial Inductance Extraction, 1997, pp. 137–140.

Ruehli, Inductance Calculations in a Complex Integrated Circuit Environment, Sep. 1972, pp. 470–481.

Weeks, et al., Resistive and Inductive Skin Effect in Rectangular Conductors, Nov. 1979, pp. 652–660.

Krauter et al., Generating sparce partial inductance matrices with guaranteed stability, IEEE, 1995, pp. 45–52.

* cited by examiner

Primary Examiner—Vuthe Siek
(74) Attorney, Agent, or Firm—Collard & Roe, P.C.

(57) ABSTRACT

A method for determining electrical characteristics of a network of conductor elements. Separate conductor elements are dissected into segments for modeling high frequency phenomenons such as proximity and skin effect. Partial impedances are assigned to the segments to describe their mutual and self inductances. When calculating the electrical characteristics of the conductor arrangement, mutual partial impedances are taken into account only between segments in spatial proximity, reducing memory requirements and increasing calculation speed. Voltages induced in spatially distant conductor elements are calculated for the determination of mutual inductive couplings between spatially distant conductor elements. The method is suitable for time and frequency domain modeling.

6 Claims, 4 Drawing Sheets

METHOD FOR DETERMINING ELECTRICAL CHARACTERISTICS OF A MULTIPLE CONDUCTOR DEVICE

CROSS REFERENCE TO RELATED APPLICATIONS

Applicants claim priority under 35 U.S.C. §119 GERMAN application No. 101 09 554.6 filed on Feb. 28, 2001.

BACKGROUND OF THE INVENTION

The invention relates to a method for determination of the electrical characteristics of an arrangement of conductor elements (conductor pieces) by means of a computer, wherein the conductor elements are at least partly dissected into segments which carry each a fraction of the total current through the related conductor element and wherein the electrical characteristics of the segments and the mutual electromagnetic couplings between the segments are modelled by means of partial impedance values which are assigned to the respective segments.

FIELD OF THE INVENTION

The invention further relates to a method for determination by means of a computer of the electrical behaviour of integrated high-frequency inductors as well as a computer program for the performing of the method in accordance with the invention.

In the field of modern microelectronics there is a trend towards smaller and smaller device dimensions and higher and higher clock rates. This leads to the development of microelectronic components requiring today a precise investigation of the high-frequency characteristics of the current carrying elements. The reason for this is that conditional on the high signal frequencies the dimensions of the conductor elements lay in the region above the skin depth, so that especially the ohmic resistance of the conductor elements will significantly depend on the frequencies of the signals to be carried. Integrated circuits normally contain a complicated arrangement of a multitude of conductor elements. The precise characterization of the electrical behaviour of such structures is of big importance because mutual inductive and capacitive couplings between the conductor elements will significantly influence the signal quality and therefore the system performance. Of special interest is the analysis of the impedance behaviour of integrated inductors as e. g. used in the modem mobile and satellite communication technology. Integrated micro-inductors are used for example in oscillators for mobile phones. The inductance and the ohmic resistance of such an inductor influences both the resonance frequency and the quality factor of the oscillator. A precise analysis of the impedance behaviour of such inductors is essential for rapid, cost effective and norm-fulfilling development of integrated circuits for the communication technology. During development of fast digital circuits it is also important to perform an analysis of the transmission characteristics of interconnects and of the interconnecting elements so that signal delay, signal cross talk, and tendencies to oscillate can be evaluated.

During development of integrated circuits in which inductors are used it is today common practice to manufacture complete inductor test fields in advance and to undertake them a characterization by measurement. This method is already disadvantageous because of the very high efforts which are caused by it. Moreover, for circuits which operate at high signal frequencies very small inductance values are needed. The dimensions of such inductors can be in the order of some tenth of microns. However, the measurement of such small impedances is difficult and the measurement results are error-prone due to the high tolerances of the available measurement instruments and due to the surrounding influence on the measurement arrangement which cannot be neglected.

Because of said reasons today one goes over to simulating the electrical characteristics of conductor arrangements before the manufacturing by means of computer-generated models. In this case methods are very powerful with which the impedance behaviour of a physical model of the related conductor arrangement is determined, wherein the model represents the real geometry of the conductor elements as close as possible. This power comes i. a. from such models allowing a broadband analysis and being applicable in both frequency domain and time domain. Therefore also non-linear effects can be analysed which are especially of big importance for circuits of the communication technology.

Such a method for calculation of the frequency-dependent resistance and inductance of an arrangement of conductor elements is proposed e. g. by Weeks et al. (IBM Journal of Research and Development, vol. 23, no. 6, pp. 652–660). The known method especially takes into account said high-frequency effects, e. g. skin effect and proximity effect. For this it is necessary to model the current density distribution inside the conductor elements. In said document for this it is proposed to dissect the conductor elements into segments which are straight and parallel to each other and which each carry a fraction of a total current through the related conductor element. There it is assumed that the current density inside the separate segments is constant. However, because the current density varies from segment to segment, the overall current density distribution of the related conductor elements is thereby reproduced as a discrete model. The known method is based on the theory of partial impedances (cf A. E. Ruehli, "Inductance Calculation in a Complex Integrated Circuit Environment", IBM Journal of Research and Development, vol. 16, pp. 417–481). With this it is possible to assign a set of partial impedance values to every separate segment with which the electrical properties of the segments and the mutual electromagnetic couplings between the segments can be fully described. The partial impedance values depend only on the geometric arrangement and the form of the segments and can be easily calculated. Even complex conductor geometries can be easily handled by performing a suitable dissection into segments. From the viewpoint of mathematics the determination of the impedance in a network of conductor elements can be done by the known method of partial impedances by solving linear equation systems. The actual analysis of the network then is done by inversion of corresponding matrices whose matrix elements are the partial impedance values of the segments. These matrices contain on the diagonal the resistances of the segments and their self-inductances. Outside the diagonal the complex symmetrical matrices contain the mutual inductance values between different segments. If a frequency dependent impedance analysis is to be performed, for every frequency to be examined an inversion of the impedance matrix has to be performed because the complex partial impedance values are naturally frequency dependent.

With the known method the said high frequency effects can be examined because those are modelled by the mutual inductive couplings between the segments. Thus it is possible to e. g. determine the frequency dependent resistance of a conductor arrangement with a given geometry. For the analysis of inductances it is important that the frequency dependence of the self inductances of the conductor elements can also be calculated with high accuracy.

With the known method, the dimension of the linear equation systems (analysis in the frequency domain) or the coupled differential equation systems (analysis in the time domain) to be solved depends on the number of segments, as described above. The application of the method is therefore limited to those cases where the arrangement of conductor elements to be examined can be modelled by dissection into a few hundred segments with sufficient accuracy. For complex conductor arrangements the known method is slow and extremely memory intensive. In addition, during examination of high signal frequencies an extremely fine dissection of the conductor elements has to be performed, because a correct modelling of the high-frequency effects can only be performed if the dimensions of the segments are smaller than the corresponding skin depth.

SUMMARY OF THE INVENTION

Starting from that, the invention is based on the problem to improve the known method of modelling the impedance behaviour of a network of conductor elements in such a way that a fast and effective analysis is also possible for complex conductor arrangements, without accepting loss of the results accuracy.

This problem is solved with a method as mentioned above in the way that during the calculation of the electrical characteristics of the whole conductor arrangement mutual partial impedances are only taken into account between segments in spatial proximity.

Therefore a physical model of the conductor arrangement is modified in a way that the electromagnetic couplings between the separate conductor elements can be performed independent of the self inductances of the respective conductor elements, because the self inductances are already being modelled by mutual couplings between the segments.

The invention is based on realization that the mentioned high-frequency effects are local phenomena phenomenons. Only electromagnetic interactions between segments in spatial proximity play a role. The couplings between distant segments are so similar to each other that these can be described by taking into account the mutual electromagnetic couplings between the conductor elements itself without losing accuracy during calculation. The dimensions of the matrices which have to be inverted during the impedance analysis according to the invention are therefore strongly reduced in comparison to the known methods. This results in a strong reduction of the required computing time as well as a significantly lower memory requirement. Spatially distant segments are treated independent of each other during the method of this invention. All in all with this method analyses even of complex conductor networks can be performed within a short time on usual computers.

The skin effect causes a concentration of the current flow in the regions near the surface of the conductor elements. The skin effect is caused by magnetic interactions inside the single conductor elements. If during the method of the invention only influences on the impedance behaviour caused by the skin effect should be taken into account, the calculation can be advantageously restricted to mutual partial impedances between the segments of the same conductor elements.

The proximity effect influences the current density distribution in directly neighboured conductor elements. The proximity effect which is based on the inductive coupling between different conductor elements is just as the skin effect only at high signal frequencies of significant influence on the impedance behaviour. The proximity effect can advantageously be modelled in the method of the invention by taking into account mutual partial impedances only between segments of the same conductor elements and directly neighboured conductor elements.

During the impedance analysis according to the method of the invention of course the electromagnetic couplings between distant conductor elements can not be left out of consideration. For determination of the mutual inductive couplings between spatially distant conductor elements it is sufficient if the induced voltages, caused by the respective total current flowing through the distant conductor elements, are calculated. That is, according to the invention the self inductances of the separate conductor elements are treated independently from the mutual couplings between the conductor elements. With this an effective impedance analysis of the whole arrangement of conductor elements is possible, wherein the high-frequency effects which only appear locally are treated separately from the inductive couplings between the spatially distant conductor elements. The particularly high effectiveness of the method according to the invention is based on this distinction, by which a particularly fast and cost effective development of integrated devices is made possible. With the described method for taking into account the interacting inductive influences between spatially distant conductor elements a coupling between conductor elements is modelled which is free of local retroaction, by which the physical reality is not fully truly represented. However, this approximation leads to a significant speed-up during the modelling of the electrical characteristics of the conductor arrangement, wherein the accuracy of the calculation is only insignificantly reduced.

For determination by a computer of the electrical behaviour of integrated high-frequency inductors which consist of a series connection of conductor sections which are flown through by a total current which is impressed onto the inductor, a method is suitable in which the conductor sections are dissected in segments which run in parallel to the direction of the current flow, wherein the segments each carry a fraction of the total current and to which respective partial impedance values are assigned, wherein during the calculation of the impedance of the inductor arrangement mutual partial impedances only between the segments of the same conductor section and the segments of directly neighboured conductor sections are taken into account, and wherein for modelling the mutual inductive coupling between the other conductor sections voltages, which are induced in those by the respective total current flowing through the distant conductor sections, are calculated. By this the application of the method according to the invention to integrated high-frequency inductors is described which usually consist of such an arrangement of inductor sections. The method according to the invention is suitable especially for the modelling of such inductors, because the separate conductor sections can be dissected very easily into segments which run in parallel to the direction of current flow. The necessary partial impedance values for the segments arranged in this way can be calculated particularly easily easy.

For performing of the method according to the invention a computer program is suitable which, starting with a set of input data by which the geometry of an arrangement of conductor elements and their electrical parameters is defined, determines the impedance behaviour of the conductor arrangement by dissecting the conductor elements at least partly into segments which run in parallel to each other, to which respective partial impedance values are assigned, wherein during the calculation of the impedance of the whole conductor arrangement mutual partial impedances only between segments in spatial proximity are taken into account and wherein in addition for each conductor element an induced voltage, caused by the total current flowing through the distant conductor elements, is calculated. Such a computer program can be implemented on usual computers without problems and can advantageously be used in combination with usual circuit simulators, e. g. SPICE. The computer program can be provided on storage media such as floppy disks or CD-ROM or for download over the internet. The computer program performing according to the method of the invention makes possible for the user a fully automatic impedance calculation of a network of conductor elements, wherein only their geometry must be predefined by the user. In addition, electrical parameters such as the specific resistance of the conductor elements are also required for the calculation.

BRIEF DESCRIPTION OF THE DRAWINGS

Examples of realization of the invention will be explained in the following by means of the figures. There is shown in.

DETAILED DESCRIPTION OF THE INVENTION

Figure 1:
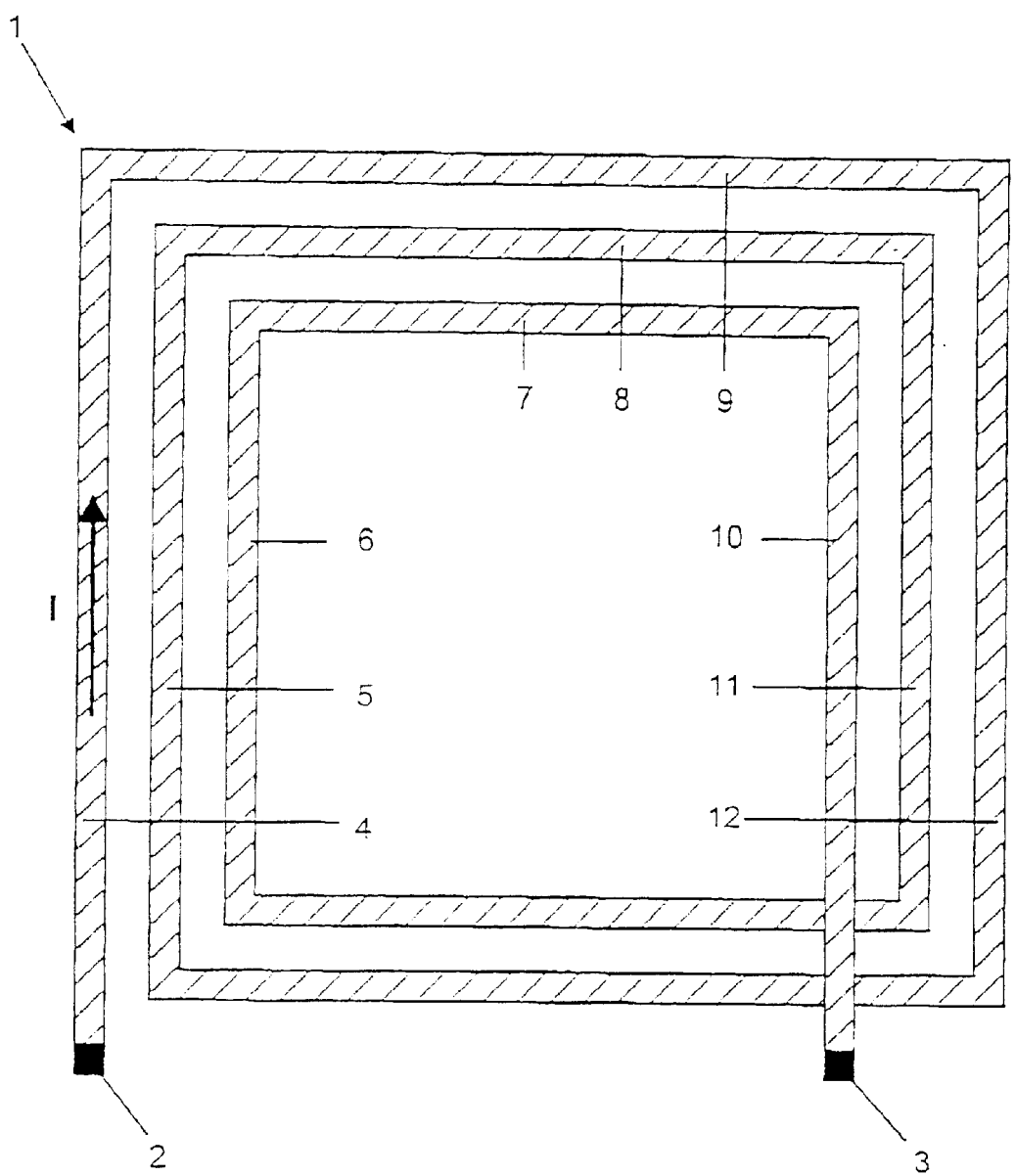
FIG. 1 a top side view on an integrated inductor.

FIG. 1 shows a top side view of an integrated planar inductor 1 of a series connection of straight conductor sections which are arranged right-angled. The inductor has contacts 2 and 3 though which a current I is impressed. FIG. 1 shows neighboured conductor sections 4, 5 and 6, which run in parallel to each other and which have a mutual magnetic coupling with which the current density distribution in the conductor cross-section is influenced (proximity effect). The resulting influence on the frequency dependent impedance of inductor 1 can be calculated with the method according to the invention. The conductor sections 7, 8 and 9 are perpendicular to the conductor sections 4, 5 and 6. Therefore there is no magnetic coupling between those sections. The conductor sections 10, 11 and 12 are spatially distant to the conductor sections 4, 5 and 6. The magnetic couplings between these distant conductor sections have no significant influence on the current density distribution in the conductor sections 4, 5 and 6. Therefore high-frequency effects don't play a role here. For the impedance analysis of the inductor arrangement it is sufficient to calculate for the separate conductor sections voltages which, caused by the total current I flowing in the distant conductor sections, are induced in those.

Figure 2:
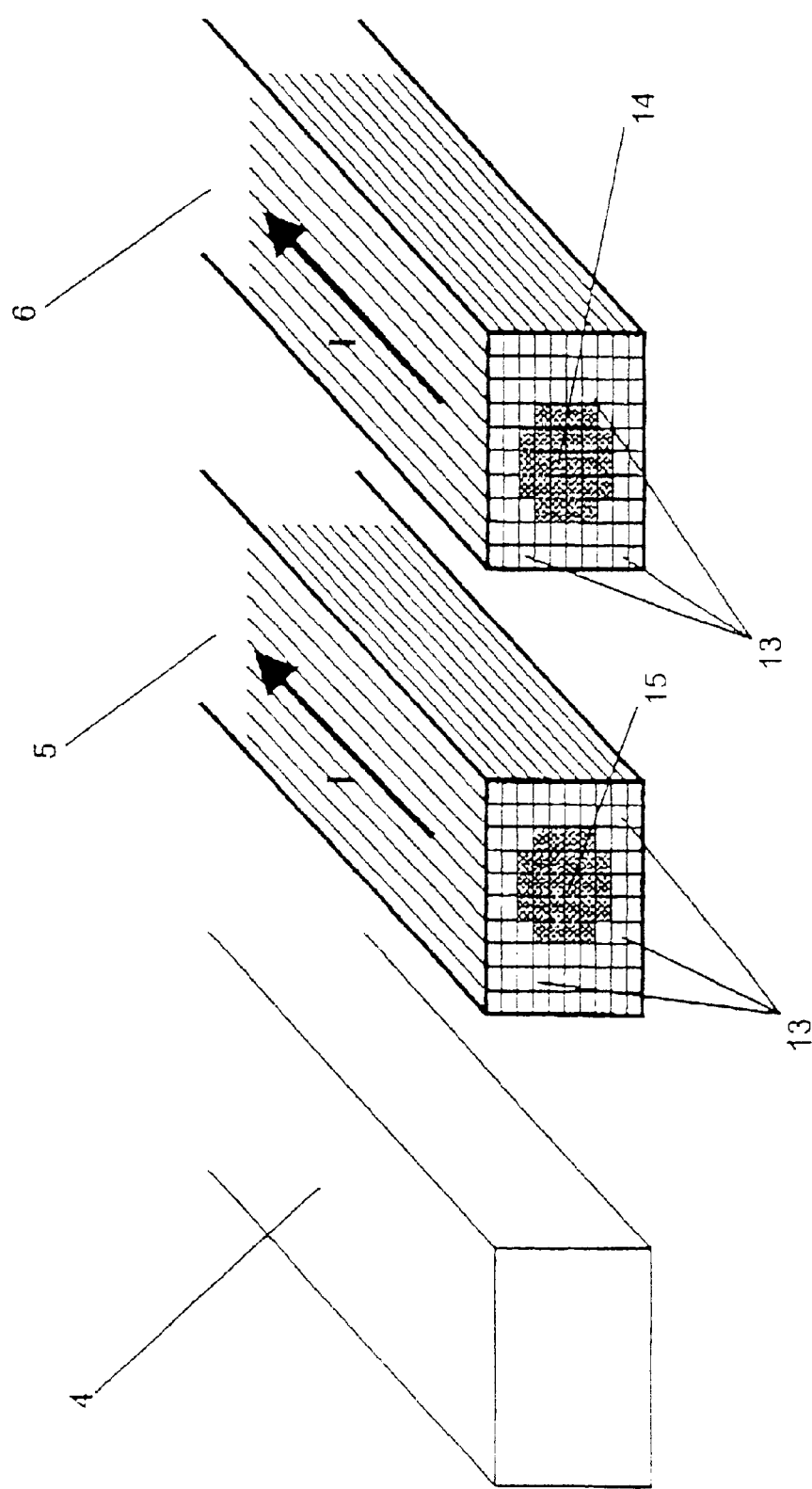
FIG. 2 a segmentation of conductor elements according to the invention.

FIG. 2 shows the conductor elements 4, 5 and 6, wherein for the conductor elements 5 and 6 the dissection according to the invention into straight segments 13 which run parallel to each other is shown. The conductor elements 5 and 6 have a rectangular cross section and they are dissected into segments 13 which also have a rectangular cross section. Every segment 13 has a set of partial impedance values assigned with which the mutual electromagnetic couplings as well as the electric characteristics of the segments 13 are described. In FIG. 2 the current density distribution inside the conductor elements 5 and 6 is shown. Due to the skin effect current-free regions 14 resp. 15 are caused in the center of the conductor cross-section. The current flow is concentrated to the surface of the conductor elements. The thickness of the current carrying surface layer depends on the frequency of the flowing current. With increasing frequency the skin depth decreases. Due to the decreasing effective conductor cross-section the resistance increases with increasing frequency. The current-free regions 14 and 15 shown in FIG. 2 are slightly shifted towards another. This is based on the magnetic interaction between the conductor elements 5 and 6 which are flown through with current in the same direction (proximity effect).

In the method according to the invention every segment 13 has an own inductance L and an ohmic resistance R assigned. In addition there are mutual inductances between different segments. Because of the mutual inductive coupling between segments inside a conductor element the skin effect is modelled. For the modelling of the proximity effect couplings, that is especially mutual partial inductances between segments from different conductor elements, must be taken into account. The total amount of the couplings to deal with therefore increases quadratically with the total amount of electromagnetically coupled segments. During the method according to the invention this amount is limited by only taking into account mutual couplings between segments in spatial proximity. There still only exists one further quadratic dependence on the typically comparatively low amount of conductor elements.

Figure 3:
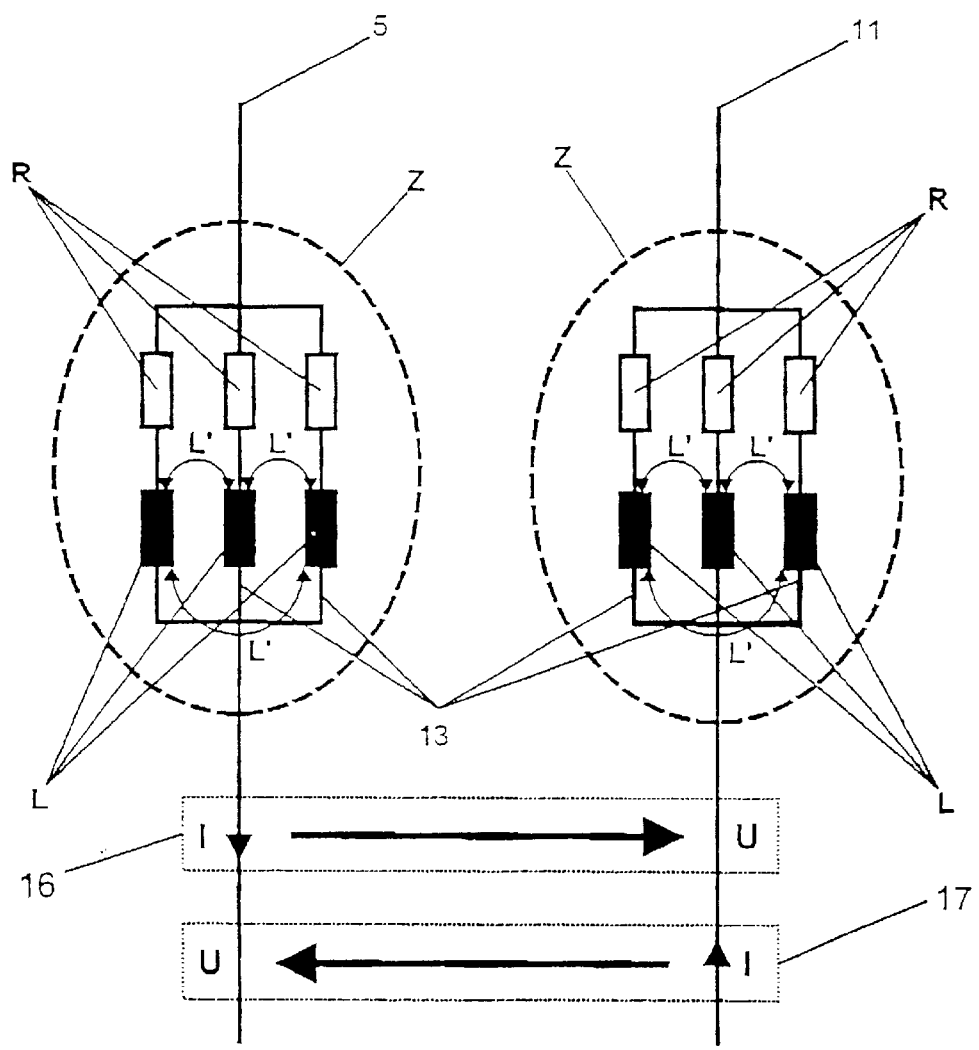
FIG. 3 a schematic representation of the method for impedance determination of an arrangement of conductor elements according to the invention.

This is shown schematically in FIG. 3. Shown are the conductor element 5 as well as the conductor element 11 which is spatially distant from this. Both conductor elements are flown through by the total current I in opposite direction. Both conductor elements 5 and 11 are respectively dissected into three segments 13. Each of the segments 13 carries a fraction of the total current I. Each of the segments 13 has also a series resistance R and a self-inductance L. The segments belonging to a respective conductor element are coupled together through mutual inductances L'. With these the named high-frequency effects are modelled. For each of the conductor elements 5 or 11 a separate impedance analysis is performed which results in a respective total impedance Z. The mutual inductive couplings between the distant conductor elements 5 and 11 then are taken into account by couplings 16 and 17, with which for each of the conductor elements 5 and 11 a voltage U is calculated which, caused by the total current I flowing in the respective other conductor element, is induced.

Figure 4:
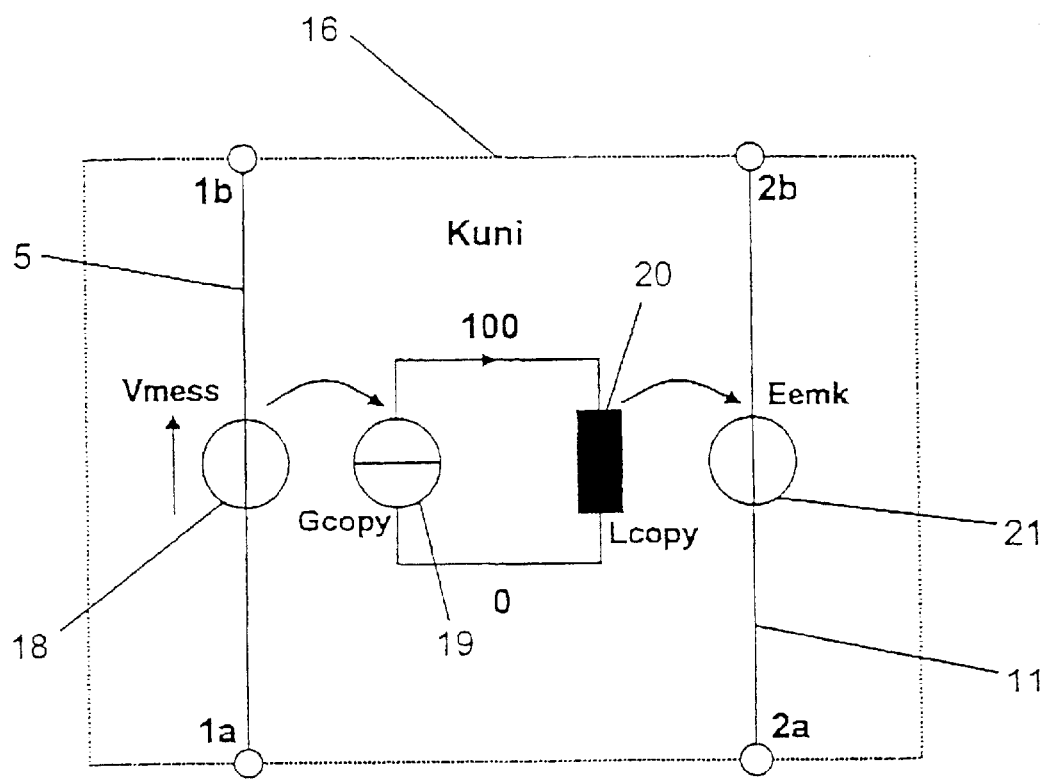
FIG. 4 a realization of the coupling between distant conductor elements in SPICE.

FIG. 4 shows a possibility for realization of the coupling between distant conductor elements with the commonly usual circuit simulator SPICE. The following source code is a netlist to be processed by the simulator, with which a replacement element 16 (subcircuit) is defined, which simulates the local retroaction-free coupling of a first conductor element 5 to a (spatially distant) second conductor element 11:

SUBCKT Kuni 1*a* 1*b* 2*a* 2*b* L1 K
   Vmess 1*a* 1*b* 0.0
   Gcopy 100 0 CCCS I(Vmess) 1.0
   Lcopy 100 0 L1
   Eemk 2*a* 2*b* VCVS 100 0 K
ENDS Kuni The coupling element 16 (Kuni) consists of a measurement element 18 (Vmess), adaption elements 19 and 20

(Gcopy, Lcopy) and a controlling element 21 (Eemk). The coupling element 16 gets from the circuit simulator as parameters the self-inductance L1 and a coupling coefficient K. The zero-voltage source 18 (Vmess) serves for determining the current though the conductor 5. This current is reproduced by the current controlled current source 19 (Gcopy) and flows through the inductance 20 (Lcopy) to build the necessary time derivative of the current. The voltage dropping above inductance 20 (Lcopy) is brought into the conductor element 11 by means of the voltage controlled voltage source 21 (Eemk). There the coupling coefficient K is taken into account, which represents the relative geometric arrangement of the conductor elements 5 and 11.

What is claimed is:

1. A method for determining electrical characteristics of an arrangement of conductor elements by means of a computer, the method comprising:

at least partly dissecting the conductor elements into segments, wherein each of said segments carries a fraction of a total current flowing through a related conductor element;

assigning partial impedance values to said segments;

modeling the electrical characteristics of said segments and a mutual electromagnetic coupling between said segments; and calculating the electrical characteristics of the conductor arrangement by taking into account only a mutual partial impedance between said segments which are in spatial proximity.

2. The method according to claim 1, wherein said mutual partial impedances is taken into account only between said segments of a same conductor element.

3. The method according to claim 1, wherein said mutual partial impedances is taken into account only between said segments of a same conductor element and directly neighboring conductor elements.

4. The method according to claim 1, further comprising the step of determining a mutual inductive coupling between spatially distant conductor elements by calculating a voltage which is induced in a conductor element by a total current flowing through a spatially distant conductor element.

5. A method for determining, by means of a computer, electrical characteristics of an integrated high frequency inductor having a series connection of conductor sections and a total current which is impressed onto the inductor and flows through the conductor section, the method comprising:

dissecting the conductor sections into segments, wherein each of said segments runs in parallel to a direction of flow of the total current and each of said segments carries a fraction of the total current;

assigning partial impedance values to said segments;

modeling a mutual inductive coupling for conductor sections which are not the same or directly neighboring by calculating a voltage induced in said conductor sections which are not the same or directly neighboring by the total current flowing through said conductor sections which are not the same or directly neighboring; and calculating an impedance of the inductor by taking into account only a mutual partial impedance between segments of a same conductor section and segments of directly neighboring conductor sections.

6. A computer program for performing the method of claim 1, comprising:

inputting a set of data defining a geometry and an electrical parameter of the arrangement of conductor elements;

at least partly dissecting the conductor elements into parallel segments;

assigning a respective partial impedance value to each of said parallel segments;

calculating an induced voltage caused by a total current flowing in spatially distant conductor elements for each of the conductor elements; and calculating an impedance of the arrangement of conductor elements by taking into account only a mutual partial impedance between said segments which are in spatial proximity.

* * * * *